United States Patent
Li et al.

(10) Patent No.: US 12,550,505 B2
(45) Date of Patent: Feb. 10, 2026

(54) SEMICONDUCTOR LIGHT-EMITTING COMPONENT AND LIGHT-EMITTING DEVICE

(71) Applicant: TIANJIN SANAN OPTOELECTRONICS CO., LTD., Tianjin (CN)

(72) Inventors: Weihuan Li, Tianjin (CN); Liwei Wang, Tianjin (CN); Xiaofeng Liu, Xiamen (CN); Duxiang Wang, Tianjin (CN); Chaoyu Wu, Xiamen (CN)

(73) Assignee: TIANJIN SANAN OPTOELECTRONICS CO., LTD., Tianjin (CN)

( * ) Notice: Subject to any disclaimer, the term of this patent is extended or adjusted under 35 U.S.C. 154(b) by 719 days.

(21) Appl. No.: 17/861,790

(22) Filed: Jul. 11, 2022

(65) Prior Publication Data

US 2023/0016028 A1    Jan. 19, 2023

(30) Foreign Application Priority Data

Jul. 12, 2021  (CN) .......................... 202110786164.1
Sep. 15, 2021  (CN) .......................... 202111077795.2

(51) Int. Cl.
  *H10H 20/824*  (2025.01)
  *H10H 20/816*  (2025.01)
  (Continued)

(52) U.S. Cl.
  CPC ........ *H10H 20/857* (2025.01); *H10H 20/852* (2025.01)

(58) Field of Classification Search
  CPC ..... H10H 20/857; H10H 20/852; H10F 30/24
  See application file for complete search history.

(56) References Cited

U.S. PATENT DOCUMENTS 5,739,553 A * 4/1998 Noto ................... H10H 20/816
                                                         257/97
6,396,862 B1 * 5/2002 Wang ................ H10D 30/0217
                                                      257/E33.07
(Continued)

FOREIGN PATENT DOCUMENTS

CN    103500784 A  *  1/2014  ............. C30B 25/02
CN    106684220 B  *  8/2019

OTHER PUBLICATIONS

Abdel Razik Degheidy, Abdel Salm Elabsy, Elkenany Brens Elkenany, Optoelectronic properties of GaAs1-xPx alloys under the influence of temperature and pressure, Superlattices and Microstructures, vol. 52, Issue 2, Aug. 2012, pp. 336-348 (Year: 2012).*

(Continued)

*Primary Examiner* — Christine S. Kim
*Assistant Examiner* — Sesha Sairaman Srinivasan
(74) *Attorney, Agent, or Firm* — Muncy, Geissler, Olds & Lowe, P.C.

(57) ABSTRACT

A semiconductor light-emitting component includes a semiconductor epitaxial structure that includes a first conductivity type semiconductor layer, an active layer, and a second conductivity type semiconductor layer. The first conductivity type semiconductor layer includes a first current spread layer having a first and second parts which are stacked on one another. The first part has an average band gap greater than that of the second part. The second part is formed by alternately stacking first sub layers and second sub layers one on another. Each of the first sub layers has a band gap different from that of each of the second sub layers. A light-emitting device including the semiconductor light-emitting component is also disclosed.

14 Claims, 5 Drawing Sheets

(51) Int. Cl.
*H10H 20/852* (2025.01)
*H10H 20/857* (2025.01)

(56) References Cited

U.S. PATENT DOCUMENTS

| | | | | |
|---|---|---|---|---|
| 2001/0020699 | A1* | 9/2001 | Kurahashi | H10D 1/021 |
| | | | | 257/E33.068 |
| 2007/0075319 | A1* | 4/2007 | Konno | H10H 20/816 |
| | | | | 257/E21.126 |
| 2007/0145405 | A1* | 6/2007 | Yamada | H10H 20/824 |
| | | | | 257/E33.068 |
| 2010/0166033 | A1* | 7/2010 | Chin | H01S 5/343 |
| | | | | 372/45.01 |
| 2011/0272719 | A1* | 11/2011 | Chen | H10H 20/816 |
| | | | | 257/94 |
| 2016/0149072 | A1* | 5/2016 | Lu | H10H 29/10 |
| | | | | 438/29 |
| 2017/0098735 | A1* | 4/2017 | Huang | H10H 20/013 |
| 2018/0145210 | A1* | 5/2018 | Zheng | H10H 20/812 |
| 2020/0020826 | A1* | 1/2020 | Li | A23B 11/25 |

OTHER PUBLICATIONS https://batop.de/information/Eg_AlGaAs.html (Year: 2024).*

* cited by examiner

SEMICONDUCTOR LIGHT-EMITTING COMPONENT AND LIGHT-EMITTING DEVICE

CROSS-REFERENCE TO RELATED APPLICATION

This application claims priorities of Chinese Invention Patent Application No. 202110786164.1, filed on Jul. 12, 2021, and Chinese Invention Patent Application No. 202111077795.2, filed on Sep. 15, 2021.

FIELD

The disclosure relates to a semiconductor light-emitting component and a light-emitting device having the same.

BACKGROUND

Light-emitting diodes (LEDs), having advantages such as high luminous intensity, high efficiency, small size, and long service life, are considered as one of the most promising light sources. LEDs have been widely applied in various fields, such as lighting, traffic signs, backlighting, car lights, and large screen display, etc. In such applications, LEDs are required to have further higher luminous intensity and efficiency.

Red LED chips are generally includes aluminum gallium indium phosphorus (AlGaInP) quaternary materials, which are epitaxially grown on gallium arsenide (GaAs) substrates. Due to the better lattice match between AlGaInP and GaAs, fewer dislocations are generated during epitaxial growth of the AlGaInP materials, and the quantum efficiency inside the AlGaInP materials is usually over 95%. In current practice, an LED chip usually includes an N-type current spread layer that is made of a single layer AlGaInP material, and a variation of Al content thereof will cause a difference on the performance of the LED chip. Higher Al content of the N-type current spread layer results in a high energy band, a high voltage, and a poor current spread ability thereof, which negatively affect a luminous intensity of LED chips. On the other hand, lower Al content of the N-type current spread layer results in an intrinsic light absorption thereof, which also negatively affects a luminous intensity of LED chips. Accordingly, improving epitaxial structure of LED chips is a key point to improve the luminous efficiency of LED chips.

SUMMARY

Therefore, an object of the disclosure is to provide a semiconductor light-emitting component and a light-emitting device each of which can alleviate at least one of the drawbacks of the prior art.

According to a first aspect of the disclosure, a semiconductor light-emitting component includes a semiconductor epitaxial structure. The semiconductor epitaxial structure has a first surface and a second surface opposite to the first surface, and includes a first conductivity type semiconductor layer, an active layer, and a second conductivity type semiconductor layer which are stacked on one another in such order along a direction away from the first surface toward the second surface. The first conductivity type semiconductor layer includes a first current spread layer having a first part and a second part which are stacked on one another along the direction away from the first surface toward the second surface. The first part has an average band gap greater than that of the second part. The second part is formed by alternately stacking first sub layers and second sub layers one on another. Each of the first sub layers has a band gap different from that of each of the second sub layers.

According to a second aspect of the disclosure, a light-emitting device includes the aforesaid semiconductor light-emitting component.

BRIEF DESCRIPTION OF THE DRAWINGS

Other features and advantages of the disclosure will become apparent in the following detailed description of the embodiments with reference to the accompanying drawings, of which.

DETAILED DESCRIPTION

Figure 1:
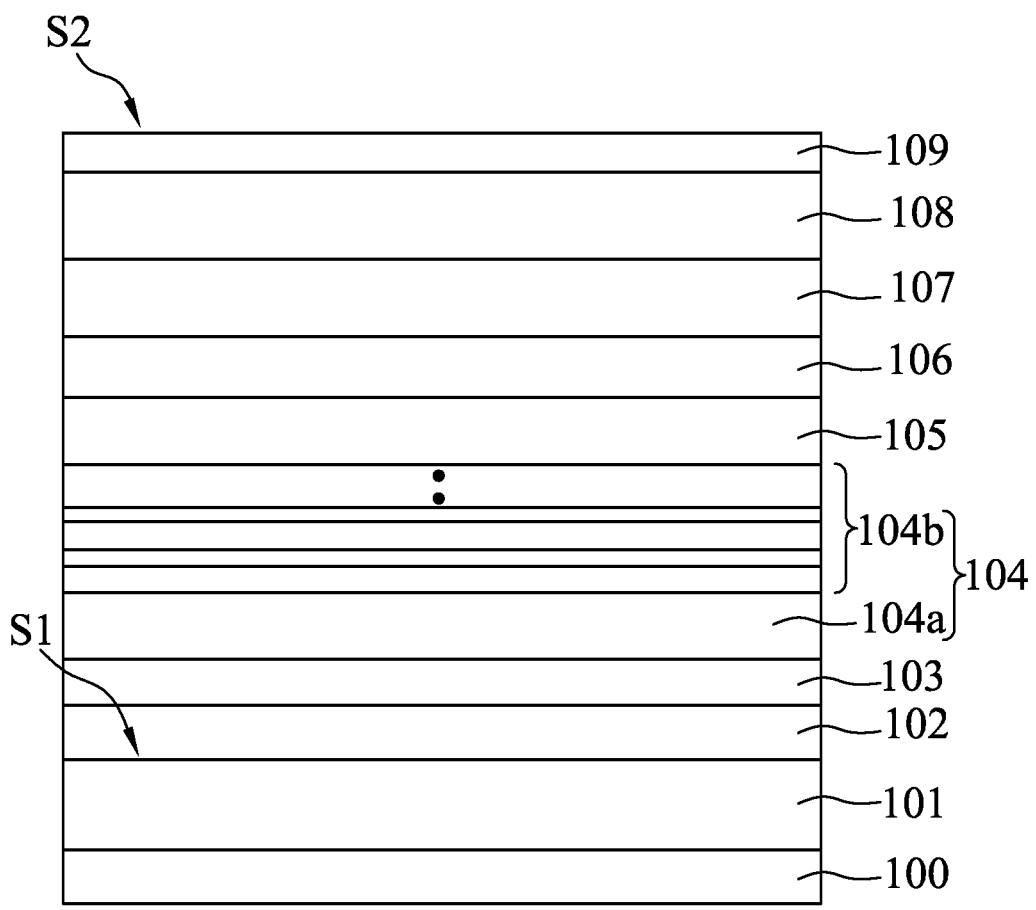
FIG. 1 is a schematic sectional view illustrating a semiconductor epitaxial structure according to a first embodiment of the present disclosure.

Before the disclosure is described in greater detail, it should be noted that where considered appropriate, reference numerals or terminal portions of reference numerals have been repeated among the figures to indicate corresponding or analogous elements, which may optionally have similar characteristics.

Referring to FIG. 1, a semiconductor epitaxial structure according to a first embodiment of the present disclosure includes a growth substrate 100, a semiconductor epitaxial structure, and a buffer layer 101 disposed between the growth substrate 100 and the semiconductor epitaxial structure.

The semiconductor epitaxial structure has a first surface S1 and a second surface S2 opposite to the first surface S1, and includes a first conductivity type semiconductor layer, an active layer 106, and a second conductivity type semiconductor layer which are stacked on one another in such order along a direction away from the first surface S1 toward the second surface S2. The first conductivity type semiconductor layer includes an etch stop layer 102, a first type ohmic contact layer 103, a first current spread layer 104, and a first cladding layer 105. The second conductivity type semiconductor layer includes a second cladding layer 107, a second current spread layer 108, and a second type ohmic contact layer 109.

The growth substrate 100 may include, for example, but not limited to, gallium arsenide (GaAs), gallium phosphide (GaP), or indium phosphide (InP). In this embodiment, the growth substrate 100 includes GaAs. Since the lattice quality of buffer layer 101 is better than that of the growth substrate 100, the growth of the buffer layer 101 on the growth substrate 100 is advantageous in eliminating the influence of lattice defects of the growth substrate 100 on the semiconductor epitaxial structure. However, in other embodiments, the buffer layer 101 can be omitted. The etch stop layer 102 is used for stopping chemical etching in a later process, and the first type ohmic contact layer 103 is used for forming a good ohmic contact. In this embodiment, the etch stop layer 102 is an N-type etch stop layer which is made of N-type gallium indium phosphide (N-GaInP). In order to facilitate removing of the growth substrate 100, preferably, the etch stop layer 102 has a thinner thickness, which may be controlled within 500 nm, or within 200 nm. However, in other embodiments, the etch stop layer 102 can be omitted. The first type ohmic contact layer 103 is an N-type ohmic contact layer which is made of N-type gallium arsenide (N-GaAs). Each of the buffer layer 101, the etch stop layer 102, and the first type ohmic contact layer 103 is doped with silicon at a certain degree of doping concentration.

Figure 2:
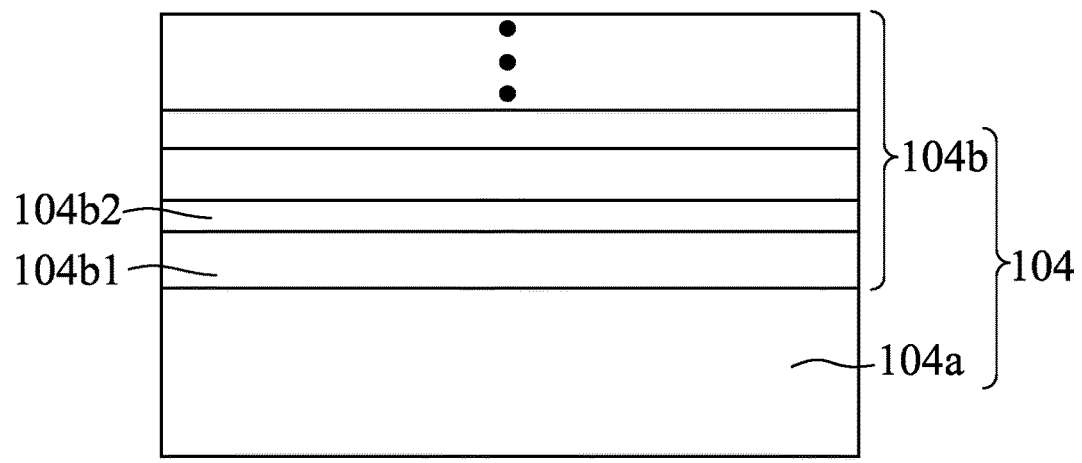
FIG. 2 is a schematic sectional view illustrating a first current spread layer of the first embodiment.

Referring to FIGS. 1 and 2, the first current spread layer 104 is provided on a surface of the first type ohmic contact layer 103, and has a first part 104a and a second part 104b which are stacked on one another along the direction away from the first surface S1 toward the second surface S2. The first part 104a has an average band gap greater than that of the second part 104b. Specifically, the first part 104a of the first current spread layer 104 have an average aluminum (Al) content that is higher than that of the second part 104b of the first current spread layer 104. The second part 104b of the first current spread layer 104 is formed by alternately stacking first sub layers 104b1 and second sub layers 104b2 one on another. Each of the first sub layers 104b1 has a band gap different from that of each of the second sub layers 104b2.

The first part 104a of the first current spread layer 104 may include $(Al_{X1}Ga_{1-X1})_{Y1}In_{1-Y1}P$. The first sub layer 104b1 and the second sub layer 104b2 of the second part 104b of the first current spread layer 104 may include $(Al_{X2}Ga_{1-X2})_{Y2}In_{1-Y2}P$ and $(Al_{X3}Ga_{1-X3})_{Y3}In_{1-Y3}P$ respectively, in which $0 \leq X3 < X2 < X1 \leq 1$, and in other embodiments, $0.3 \leq X1-X2 \leq 0.4$ and $0.1 \leq X2-X3 \leq 0.3$.

In some embodiments, in $(Al_{X1}Ga_{1-X1})_{Y1}In_{1-Y1}P$ of the first part 104a of the first current spread layer 104, X1 ranges from 0.6 to 1. When the first part 104a of the first current spread layer 104 has a higher Al content, the light absorption of $(Al_{X1}Ga_{1-X1})_{Y1}In_{1-Y1}P$ can be reduced, a subsequent roughening step of a wafer manufacturing process can be facilitated, and the luminous intensity of emitted light can be improved. In other embodiments, the first part 104a of the first current spread layer 104 has a thickness ranging from 1.5 μm to 2.5 μm, and has a doping concentration ranging between $6 \times 10^{17}$ cm$^{-3}$ and $3.5 \times 10^{18}$ cm$^{-3}$.

In some embodiments, in $(Al_{X2}Ga_{1-X2})_{Y2}In_{1-Y2}P$ and $(Al_{X3}Ga_{1-X3})_{Y3}In_{1-Y3}P$ of the first and second sub layers 104b1, 104b2 of the second part 104b of the first current spread layer 104, X2 ranges from 0.3 to 0.5, and X3 ranges from 0.1 to 0.3. The first sub layer 104b1 of the second part 104b of the first current spread layer 104 has a thickness ranging from 15 nm to 35 nm, and has a doping concentration ranging between $6 \times 10^{17}$ cm$^{-3}$ and $3 \times 10^{18}$ cm$^{-3}$. The second sub layer 104b2 of the second part 104b of the first current spread layer 104 has a thickness ranging from 10 nm to 20 nm, and has a doping concentration ranging between $6 \times 10^{17}$ cm$^{-3}$ and $2.5 \times 10^{18}$ cm$^{-3}$. The second part 104b of the first current spread layer 104, being formed by alternately stacking two sub layers which differ in Al content and doping concentration, can enhance the lateral spread of current to thereby improve the uniformity of the current spread. In some embodiments, the number of periodic cycles of a stack formed from the first and second sub layers 104b1, 104b2 of the first current spread layer 104 ranges from 15 to 30.

In this embodiment, as stated above, the first current spread layer 104 has the first and second parts 104a, 104b which are differ in Al content, and the second part 104b has two sub layers which alternates with one another and which differ in Al content (i.e., differ in band gap). This arrangement can change a trend to propagate dislocations, block generation of dislocations, and improve the crystal quality inside the epitaxial structure, thereby reducing light absorption and current leakage.

The structural design of the first current spread layer 104 in this embodiment is beneficial to facilitate a uniform current spread in each layer, which enhances the luminous efficiency of the semiconductor light-emitting component.

The first and second conductivity type semiconductor layers respectively have the first and second cladding layers 105, 107, one of which provides electrons and the other of which provides holes for the active layer 106. Each of the first and second cladding layers 105, 107 includes, for example, aluminum gallium indium phosphorus (AlGaInP), aluminum indium phosphorus (AlInP), or aluminum gallium arsenic (AlGaAs). When the active layer 106 includes aluminum indium phosphorus (AlGaInP), the first and second cladding layers 105, 107 include aluminum indium phosphorus (AlInP) so as to provide holes and electrons for the active layer 106.

In some embodiments, the first cladding layer 105 has a thickness ranging from 0.2 μm to 1.2 μm, and has a doping concentration ranging between $6 \times 10^{17}$ cm$^{-3}$ and $4 \times 10^{18}$ cm$^{-3}$. In a certain embodiment, the first cladding layer 105 has a thickness ranging from 0.3 μm to 0.5 μm. The thickness of the first cladding layer 105 may be adjusted to reduce internal resistance thereof, to thereby reduce the voltage of the semiconductor light-emitting component and improve the luminous intensity of the semiconductor light-emitting component. In some embodiments, the second cladding layer 107 has a thickness ranging from 0.2 μm to 1.2 μm, and has a doping concentration ranging between $8 \times 10^{17}$ cm$^{-3}$ and $1.5 \times 10^{18}$ cm$^{-3}$. In a certain embodiment, the second cladding layer 107 has a thickness ranging from 0.4 μm to 0.6 μm. The thickness of the second cladding layer 107 may be adjusted to reduce internal resistance thereof, to thereby reduce the voltage of the semiconductor light-emitting component and improve the luminous intensity of the semiconductor light-emitting component.

The active layer 106 is a region where electrons and holes recombine to emit light, and may has a periodic structure including single-quantum wells or multiple-quantum wells. A type of semiconductor material forming the active layer 106 can be selected depending on a desired wavelength of light emitted by the active layer 106. The active layer 106 may include well layers and barrier layers, and each barrier layer has a band gap greater than that of each well layer. The wavelength of light emitted by the active layer 106 can be adjusted by modulating the composition of the active layer 106. In some embodiments, the active layer 106 includes a material that provides electroluminescent radiation, such as AlGaInP or AlGaAs, and emits light having a wavelength ranging from 550 nm to 950 nm, such as red, yellow, orange, or infrared light. In this embodiment, the active layer 106 includes AlGaInP, which forms a single-quantum well or a multiple-quantum well, and the semiconductor epitaxial structure is configured to emit red light.

The semiconductor epitaxial structure may be formed using, for example, physical vapor deposition (PVD), chemical vapor deposition (CVD), epitaxy growth technology, or atomic layer deposition (ALD).

In this embodiment, the second current spread layer 108 includes gallium phosphide (GaP), has a thickness ranging from 0.2 μm to 1.5 μm, and has a doping concentration ranging between $9 \times 10^{17}$ cm$^{-3}$ and $1.5 \times 10^{18}$ cm$^{-3}$. By thinning the thickness of the second current spread layer 108, the light absorption of the second current spread layer 108 can be reduced, thereby enhancing luminous intensity of the semiconductor light-emitting component.

In this embodiment, the second ohmic contact layer 109 includes gallium phosphide (GaP), has a thickness ranging from 0.1 μm to 0.2 μm, and has a doping concentration greater than $1 \times 10^{19}$ cm$^{-3}$, such as $5 \times 10^{19}$ cm$^{-3}$, for achieving an optimal ohmic contact.

Figure 3:
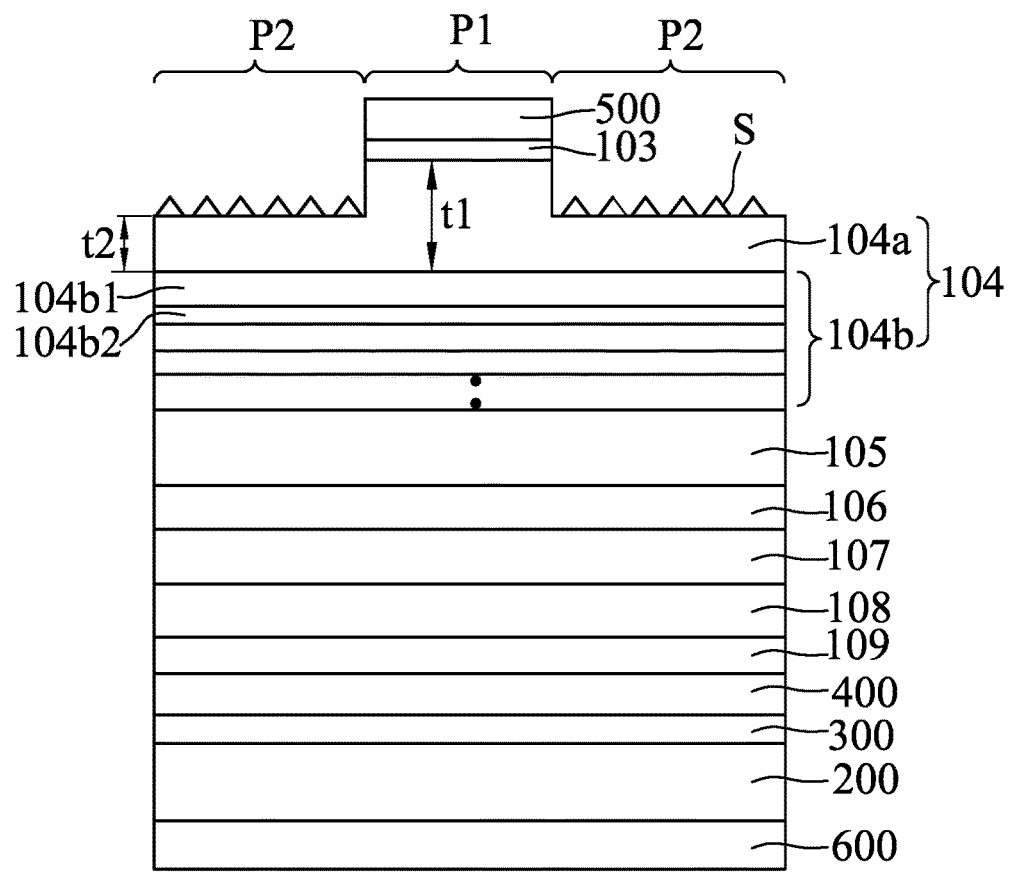
FIG. 3 is a schematic sectional view illustrating a semiconductor light-emitting component according to the first embodiment of the present disclosure.

Referring to FIG. 3, a semiconductor light-emitting component according to the first embodiment of the present disclosure is shown to include a substrate 200, a bonding layer 300, a reflective layer 400, the semiconductor epitaxial structure shown in FIG. 1, a first electrode 500, and a second electrode 600.

The semiconductor epitaxial structure and the reflective layer 400 is bonded to the substrate 200 via the bonding layer 300. The semiconductor epitaxial structure includes the second ohmic contact layer 109, the second current spread layer 108, the second cladding layer 107, the active layer 106, the first cladding layer 105, the first current spread layer 104, and the first ohmic contact layer 103 which are stacked on one another. The second ohmic contact layer 109, the second current spread layer 108, and the second cladding layer 107 form the second conductivity type semiconductor layer. The first cladding layer 105, the first current spread layer 104, and the first ohmic contact layer 103 form the first conductivity type semiconductor layer.

The substrate 200 is a conductive substrate which may include silicon, silicon carbide, or a metallic material such as Cu, W, or Mo. In order to have a sufficient mechanical strength for supporting the semiconductor epitaxial structure, the substrate 200 may have a thickness greater than 50 μm. Besides, in order to facilitate a mechanical processing of the substrate 200 that may be performed after the substrate 200 is bonded to the semiconductor epitaxial structure, the substrate 200 may have a thickness not greater than 300 μm. In this embodiment, the substrate 200 is a silicon substrate.

The first current spread layer 104 has the second part 104b and the first part 104a which are stacked on one another along a direction away from the substrate 200. The first part 104a has an average band gap greater than that of the second part 104b. The second part 104b of the first current spread layer 104 is formed by alternately stacking first sub layers 104b1 and second sub layers 104b2 one on another. Each of the first sub layers 104b1 has a band gap different from that of each of the second sub layers 104b2.

In this embodiment, the first electrode 500 is disposed on the first ohmic contact layer 103 so as to form an ohmic contact therebetween. As shown in FIG. 3, the first ohmic contact layer 103 is located only at a position perpendicularly beneath the first electrode 500. The first current spread layer 104 includes a covered part (P1) that is covered by the first electrode 500 and an uncovered part (P2) that is not covered by the first electrode 500. The exposed surface of the uncovered part (P2) is defined as a light exit surface (S). The light exit surface (S) of the first current spread layer 104 may be formed around the first electrode 500. The light exit surface (S) may be a patterned surface or a roughened surface. To be specific, the patterned surface may be formed by an etching process. The roughened surface may be a regular structured surface, or an irregular micro/nano structured surface. Patterning or roughening of the light exit surface (S) can enhance a light extraction efficiency of the semiconductor light-emitting component. In this embodiment, the light exit surface (S) is a roughened surface having a surface roughness of below 1 μm. That is to say, a height deviation (or height differences) of the roughened surface is less than 1 μm, such as ranging from about 100 Å to about 300 Å.

A surface of the covered part (P1) of the first current spread layer 104 is not etched since it is covered by the first electrode 500. A height of the roughened surface of the light exit surface (S) is substantially lower than that of the surface of the covered part (P1) due to the etching process.

Referring to FIG. 3, specifically, the covered part (P1) has a thickness (t1) ranging from 1.5 μm to 2.5 μm, and the uncovered part (P2) has a thickness (t2) ranging from 0.5 μm to 1.5 μm. The thickness (t1) of the covered part (P1) is greater than the thickness (t2) of the uncovered part (P2). In some embodiments, the thickness (t1) of the covered part (P1) is greater than the thickness (t2) of the uncovered part (P2) by at least 0.3 μm.

The reflective layer 400 may be, but is not limited to, a metallic reflective layer, an omnidirectional reflector (ODR) that is formed from a metallic reflective layer and a transparent dielectric layer, an omnidirectional reflector formed from a metallic reflective layer and a transparent conductive layer, or a Distributed Bragg Reflector (DBR) layer. The DBR layer is formed by alternately stacking two transparent dielectric layers which have different refractive indices, such as silicon oxide and titanium oxide. The reflective layer 400 reflects the light emitted from the active layer 106 to the light exit surface (S) of the current spread layer 104 or to side walls of the semiconductor epitaxial structure for exiting light.

It is noted that the reflective layer 400 may be omitted in some embodiments.

In some embodiments, the second electrode 600 is formed on the substrate 200 opposite to the bonding layer 300, or on the same side of the substrate 200 as the semiconductor epitaxial structure. Each of the first and second electrodes 500, 600 includes a transparent conductive material and/or a metallic material. Examples of the transparent conductive material include ITO and IZO. The metallic material includes at least one of GeAuNi, AuGe, AuZn, Au, Al, Pt, and Ti.

In this embodiment, by virtue that: the first current spread layer 104 includes the first and second parts 104a, 104b; the average band gap of the first part 104a is greater than that of the second part 104b; the second part 104b is formed by alternately stacking the first sub layers 104b1 and second sub layers 104b2; and each of the first sub layers 104b1 has a band gap different from that of each of the second sub layers 104b2, the lateral current spreading capability of the semiconductor epitaxial structure can be improved, the operating voltage of the semiconductor light-emitting component including the semiconductor epitaxial structure can be reduced, and the light emitting efficiency of the semiconductor light-emitting component can be improved.

A second embodiment of the present disclosure is directed to a method for preparing the first embodiment of the semiconductor light-emitting component and includes following steps.

First, the growth substrate 100 shown in FIG. 1, such as a GaAs substrate is prepared, and the semiconductor epitaxial structure is grown on the growth substrate 100 using an epitaxial growth technique such as metalorganic chemical vapour deposition (MOCVD). The semiconductor epitaxial structure includes the buffer layer 101, the etch stop layer 102, the first ohmic contact layer 103, the first current spread layer 104, the first cladding layer 105, the active layer 106, the second cladding layer 107, the second current spread layer 108, and the second ohmic contact layer 109 which are stacked on one another.

Figure 4:
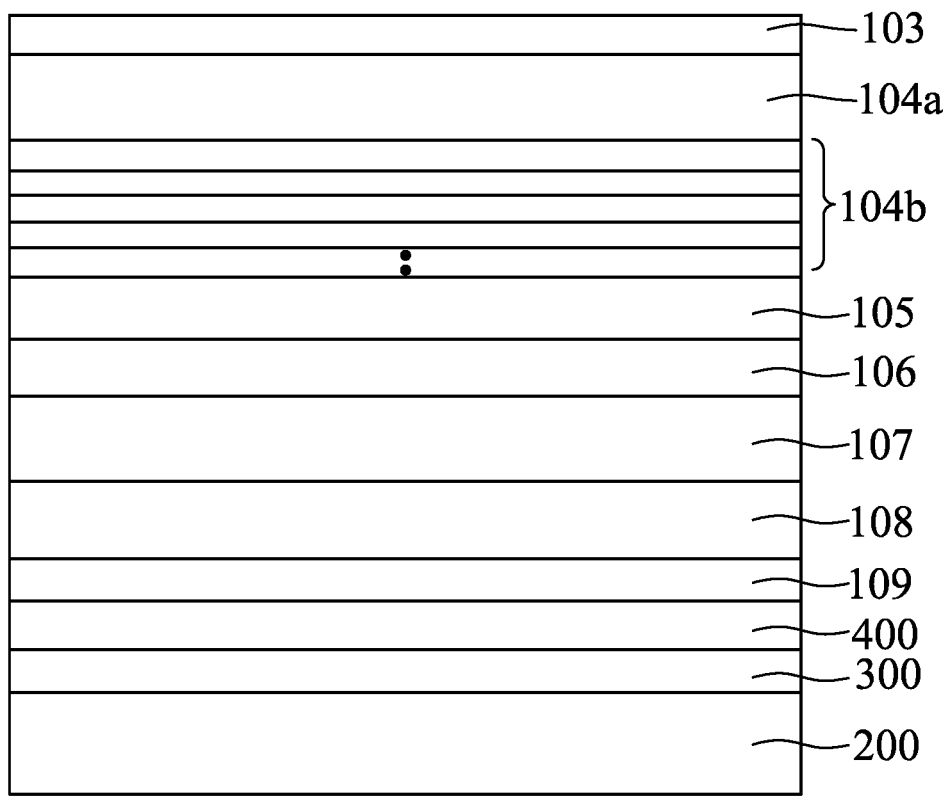
FIGS. 4 to 6 are schematic views illustrating a method for manufacturing the semiconductor light-emitting component according to a second embodiment of the disclosure.

Second, the semiconductor epitaxial structure is transferred to the substrate 200 shown in FIG. 3. Then, the growth substrate 100, the buffer layer 101, and the etch stop layer 102 are removed so that a structure shown in FIG. 4 is obtained. Specifically, the following steps are performed, which include forming the reflective layer 400 on the second ohmic contact layer 109, forming the bonding layer 300 on the reflective layer 400, bonding the bonding layer 300 to the substrate 200, and removing the growth substrate 100, the buffer layer 101, and the etch stop layer 102 so as to expose the first ohmic contact layer 103. In case that the growth substrate 100 is a GaAs substrate, removals of the growth substrate 100, the buffer layer 101, and the etch stop layer 102 are performed by a wet etching process until the first ohmic contact layer 103 is exposed.

Figure 5:
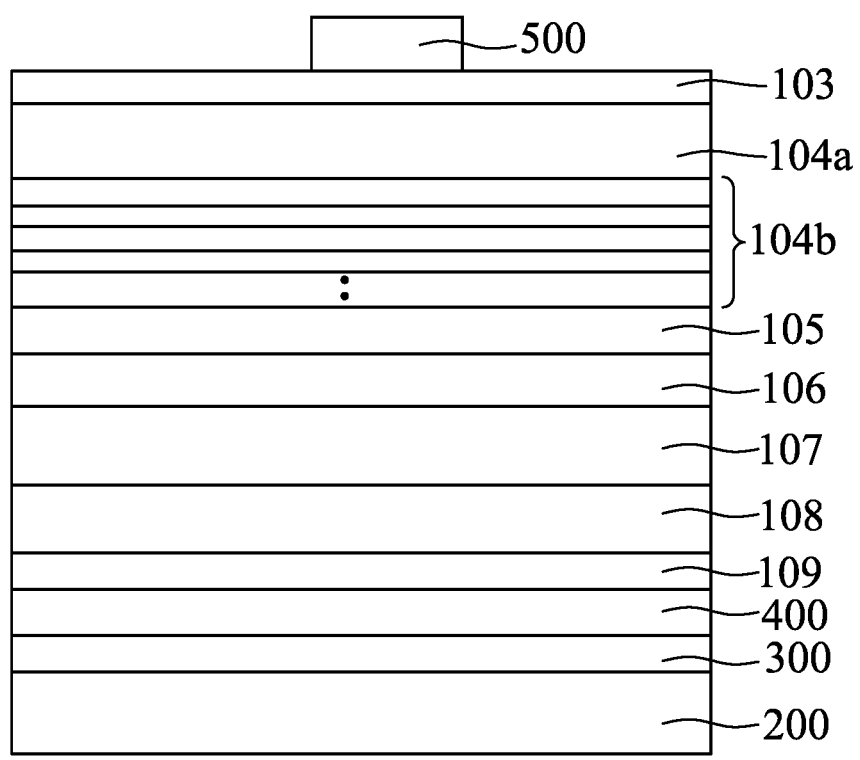

Next, as shown in FIG. 5, the first electrode 500 is formed on the first ohmic contact layer 103 so as to form a good ohmic contact therebetween, wherein the first current spread layer 104 has not been formed into the covered part (P1) covered by the first electrode 500 and the uncovered part (P2) not covered by the first electrode 500.

Figure 6:
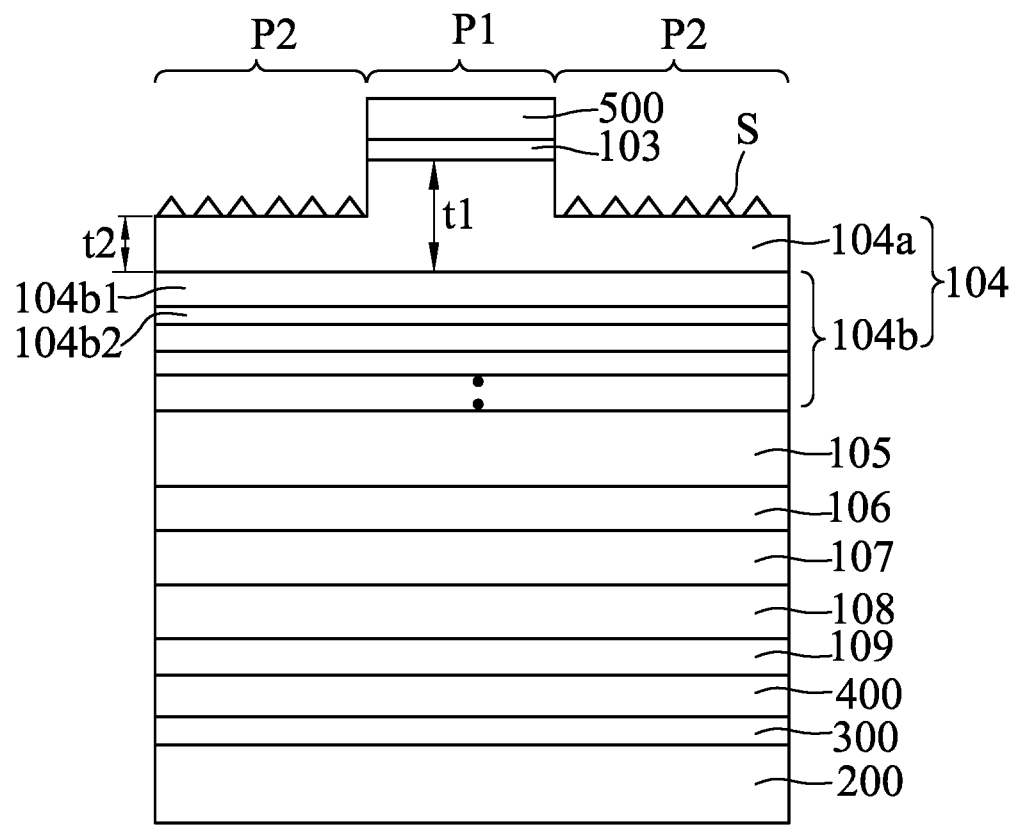

Then, a mask (not shown) is formed to cover the first electrode 500 so that a part of the ohmic contact layer 103 around the first electrode 500 remains exposed. Subsequently, the exposed part of the ohmic contact layer 103 is subjected to an etching process to be entirely removed so as to expose the uncovered part (P2) of the first current spread layer 104. Then, a surface of the uncovered part (P2) of the first current spread layer 104 is subjected to an etching process to be patterned or roughened so as to form the light exit surface (S) as shown in FIG. 6. Removal of the first ohmic contact layer 103 and the first current spread layer 104 as described above may be performed together through a single wet etching step, or separately through multiple wet etching steps. A solution used in the wet etching process may be an acidic solution or any other applicable chemical reagent. Examples of the acidic solution include a hydrochloric acid solution, a sulfuric acid solution, a hydrofluoric acid solution, and a citric acid solution.

Next, as shown in FIG. 3, the second electrode 600 is formed on the substrate 200 opposite to the bonding layer 300, so that a current can flow through the first electrode 500, the semiconductor epitaxial structure and the second electrode 600. The substrate 200 has a thickness capable of supporting all layers thereon.

Finally, a cutting process such as dicing or etching is performed according to the desired size of the semiconductor light-emitting component to be made, so as to obtain individual semiconductor light-emitting components (not shown).

Figure 7:
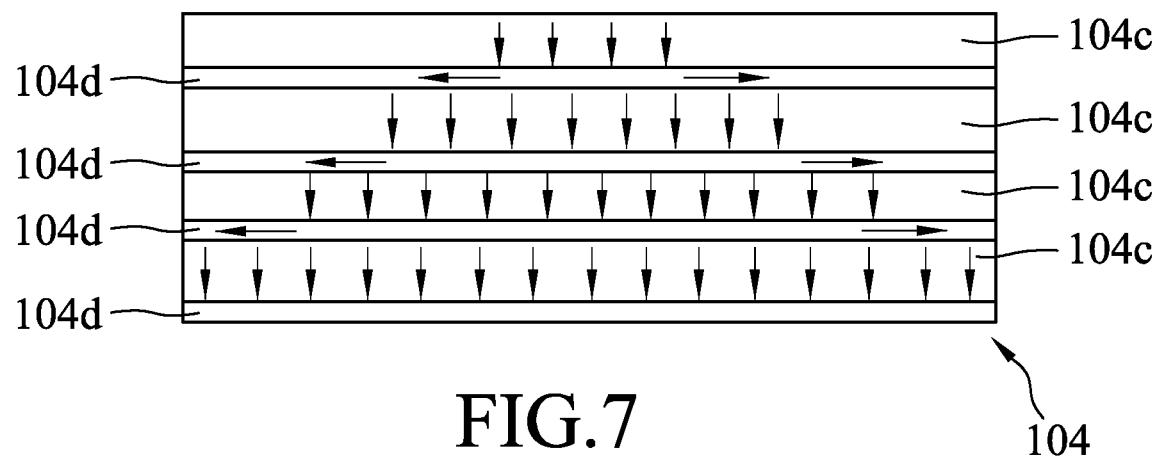
FIG. 7 is a schematic sectional view illustrating the semiconductor light-emitting component according to a third embodiment of the present disclosure.

Referring to FIG. 7, the semiconductor light-emitting component according to a third embodiment of the present disclosure is shown. In this embodiment, the semiconductor light-emitting component has a structure similar to that of the first embodiment except that the first current spread layer 104 is formed from first doped layers 104c and second doped layers 104d which are alternately stacked on one another. Each of the first doped layers 104c has a doping concentration greater than that of each of the second doped layer 104d. In some embodiments, for further enhancing the current spread ability of the first current spread layer 104, each of the first doped layers 104c has a doping concentration not less than three times that of each of the second doped layer 104d. In this embodiment, each of the first doped layers 104c has a doping concentration three times that of each of the second doped layer 104d. Generally, the thicker the current spread layer is, the more it will absorb light, resulting in low light output efficiency. On the other hand, the thinner the current spread layer is, the less it has current spread ability. To ensure better current spread, the first current spread layer 104 may have a thickness greater than 2 µm. In some embodiments, the first current spread layer 104 has a thickness ranging from 2 µm to 6 µm. In this embodiment, the first current spread layer 104 has a thickness ranging from 3 µm to 4 µm. The thickness ratio of the first doped layer 104c having higher doping concentration and the second doped layer 104d having lower doping concentration and the difference in doping concentration therebetween are also important factors affecting the current spread ability of the first current spread layer 104. In this embodiment, the first doped layer 104c has a thickness greater than that of the second doped layer 104d, for allowing the first doped layer 104c, which has higher doping concentration, to rapidly conduct current downward, and for allowing the second doped layer 104d, which has lower doping concentration, to spread current effectively to a lateral area. In some embodiment, a thickness ratio of the first doped layer 104c to the second doped layer 104d is in a range between 3:1 and 6:1. For example, when the thickness of the first doped layer 104c is 2 µm, the total thickness of the second doped layer 104d may be 1 µm. In some embodiments, the number of periodic cycles of a stack formed from the first and second doped layers 104c, 104d of the first current spread layer 104 ranges from 2 to 20, such as 6 to 10. Such configuration of the first current spread layer 104 enhances the uniformity of the current spread so as to allow current to be spread into each layer. The first current spread layer 104 includes $(Al_{X1}Ga_{1-X})_Y In_{1-Y}P$, in which $0 \leq X \leq 1$, $0 \leq Y \leq 1$, and/or $Al_X Ga_{1-X}As$, in which $0.45 \leq X \leq 1$. The materials of the first and second doped layers 104c, 104d may be the same or may be different. In this embodiment, the first current spread layer 104 includes $(Al_{0.6}Ga_{0.4})_{0.5}In_{0.5}P$.

In this embodiment, by virtue of the first current spread layer 104 which is formed from the first and second doped layers 104c, 104d which are alternately stacked on one another, and in which each of the first doped layers 104c has a doping concentration greater than that of each of the second doped layer 104d, the first current spread layer 104 has an enhanced current spread ability, thereby improving the anti-static performance of the semiconductor epitaxial structures.

The present disclosure also provides a light-emitting device that include the semiconductor light-emitting component of the first or third embodiment of this disclosure.

In sum, the semiconductor light-emitting component of the first embodiment of this disclosure includes the first current spread layer 104 that has the first and second parts 104a, 104b. The first part 104a has an average band gap greater than that of the second part 104b. The second part 104b is formed by alternately stacking the first sub layers 104b1 and the second sub layers 104b2 one on another, and each of the first sub layers 104b1 has a band gap different from that of each of the second sub layers 104b2. The first current spread layer 104 includes lower Al content material, which can reduce the energy band, so that the voltage of the semiconductor light-emitting component can be lowered, and the light emitting efficiency of the semiconductor light-emitting component can be improved. Since the second part 104b of the first current spread layer 104 is formed by alternately stacking the first sub layers 104b1 and the second sub layers 104b2 which have different band gaps and different doping concentrations, the lateral current spread in the semiconductor light emitting element can be enhanced, thereby broadening the light output angle of the semiconductor light-emitting component and improving the luminous intensity of the semiconductor light-emitting component. By virtue of such configuration of the first current spread layer 104, the material quality thereof can be improved to block the generation of dislocations and enhance the intrinsic crystal quality of the semiconductor light-emitting component, thereby reducing light absorption and current leakage.

Besides, the semiconductor light-emitting component of the third embodiment of this disclosure is formed from the first and second doped layers 104c, 104d which are alternately stacked on one another, and in which each of the first doped layers 104c has a doping concentration greater than that of each of the second doped layer 104d. By virtue of such configuration, the first current spread layer 104 has an enhanced current spread ability, thereby improving the antistatic performance of the semiconductor epitaxial structures.

In the description above, for the purposes of explanation, numerous specific details have been set forth in order to provide a thorough understanding of the embodiments. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects, and that one or more features or specific details from one embodiment may be practiced together with one or more features or specific details from another embodiment, where appropriate, in the practice of the disclosure.

While the disclosure has been described in connection with what are considered the exemplary embodiments, it is understood that this disclosure is not limited to the disclosed embodiments but is intended to cover various arrangements included within the spirit and scope of the broadest interpretation so as to encompass all such modifications and equivalent arrangements.

What is claimed is:

1. A semiconductor light-emitting component, comprising a semiconductor epitaxial structure and a first electrode, said semiconductor epitaxial structure having a first surface and a second surface opposite to said first surface, and including a first conductivity type semiconductor layer, an active layer, and a second conductivity type semiconductor layer which are stacked on one another in such order along a direction away from said first surface toward said second surface, wherein said first conductivity type semiconductor layer includes a first current spread layer having a first part and a second part which are stacked on one another along the direction away from said first surface toward said second surface, said first part having an average band gap greater than that of said second part, said first part having an average aluminum content that is higher than an average aluminum content of said second part, a surface of said first part opposite to said second part being a light exit surface of said first current spread layer, said second part being formed by alternately stacking first sub layers and second sub layers one on another, each of said first sub layers having a band gap different from that of each of said second sub layers;

wherein said first electrode is disposed on said first current spread layer, wherein said first current spread layer includes a covered part that is covered by said first electrode and an uncovered part that is not covered by said first electrode, an exposed surface of said uncovered part being defined as said light exit surface, said covered part having a thickness ranging from 1.5 μm to 2.5 μm, said uncovered part having a thickness ranging from 0.5 μm to 1.5 μm, and wherein said light exit surface of said uncovered part of said first current spread layer is patterned or roughened and has a surface roughness of below 1 μm.

2. The semiconductor light-emitting component as claimed in claim 1, wherein said first part of said first current spread layer includes $(Al_{X1}Ga_{1-X1})_{Y1}In_{1-Y1}P$, said first sub layer and said second sub layer of said second part of said first current spread layer include $(Al_{X2}Ga_{1-X2})_{Y2}In_{1-Y2}P$ and $(Al_{X3}Ga_{1-X3})_{Y3}In_{1-Y3}P$ respectively, in which $0 \leq X3 < X2 < X1 \leq 1$.

3. The semiconductor light-emitting component as claimed in claim 2, wherein $0.3 \leq X1-X2 < 0.4$.

4. The semiconductor light-emitting component as claimed in claim 2, wherein $0.1 \leq X2-X3 \leq 0.3$.

5. The semiconductor light-emitting component as claimed in claim 2, wherein X1 ranges from 0.6 to 1, X2 ranges from 0.3 to 0.5, and X3 ranges from 0.1 to 0.3.

6. The semiconductor light-emitting component as claimed in claim 1, wherein said first part of said first current spread layer has a doping concentration ranging between $6 \times 10^{17}$ cm$^{-3}$ and $3.5 \times 10^{18}$ cm$^{-3}$.

7. The semiconductor light-emitting component as claimed in claim 1, wherein said first sub layer of said second part of said first current spread layer has a thickness ranging from 15 nm to 35 nm, and said second sub layer of said second part of said first current spread layer has a thickness ranging from 10 nm to 20 nm.

8. The semiconductor light-emitting component as claimed in claim 1, wherein said first sub-layer of said second part of said first current spread layer has a doping concentration ranging between $6 \times 10^{17}$ cm$^{-3}$ and $3 \times 10^{18}$ cm$^{-3}$, and said second sub layer of said second part of said first current spread layer has a doping concentration ranging between $6 \times 10^{17}$ cm$^{-3}$ and $2.5 \times 10^{18}$ cm$^{-3}$.

9. The semiconductor light-emitting component as claimed in claim 1, wherein the number of periodic cycles of a stack formed from said first and second sub layers of said first current spread layer ranges from 15 to 30.

10. The semiconductor light-emitting component as claimed in claim 1, wherein said first conductivity type semiconductor layer further includes a first cladding layer that has a thickness ranging from 0.2 μm to 1.2 μm, and that has a doping concentration ranging between $6 \times 10^{17}$ cm$^{-3}$ and $4 \times 10^{18}$ cm$^{-3}$.

11. The semiconductor light-emitting component as claimed in claim 1, wherein said second conductivity type semiconductor layer includes a second cladding layer that has a thickness ranging from 0.2 μm to 1.2 μm, and that has a doping concentration ranging between $8 \times 10^{17}$ cm$^{-3}$ and $1.5 \times 10^{18}$ cm$^{-3}$.

12. The semiconductor light-emitting component as claimed in claim 1, wherein said second conductivity type semiconductor layer includes a second current spread layer that has a thickness ranging from 0.2 µm to 1.5 µm, and that has a doping concentration ranging between $9\times10^{17}$ cm$^{-3}$ and $1.5\times10^{18}$ cm$^{-3}$.

13. The semiconductor light-emitting component as claimed in claim 1, wherein said semiconductor epitaxial structure is configured to emit red light.

14. A light-emitting device comprising the semiconductor light-emitting component as claimed in claim 1.

* * * * *